United States Patent [19]
Nishizaka et al.

[11] Patent Number: 5,790,450
[45] Date of Patent: Aug. 4, 1998

[54] SEMICONDUCTOR MEMORY DEVICE HAVING BIT LINES WIDELY SPACED WITHOUT SACRIFICE OF NARROW PITCH OF SOURCE/DRAIN LINES OF MEMORY CELLS

[75] Inventors: Teiichiro Nishizaka; Kazuyuki Yamasaki, both of Tokyo, Japan

[73] Assignee: NEC Corporation, Tokyo, Japan

[21] Appl. No.: 730,677

[22] Filed: Oct. 11, 1996

[30] Foreign Application Priority Data

Oct. 11, 1995 [JP] Japan .................... 7-263003

[51] Int. Cl.[6] ............................... G11C 17/00
[52] U.S. Cl. ...................... 365/104; 365/94; 365/72; 365/230.03; 365/63
[58] Field of Search ............... 365/104, 94, 72, 365/63, 130.03

[56] References Cited

U.S. PATENT DOCUMENTS 5,202,848  4/1993  Nakagawara .................. 365/104
5,392,233  2/1995  Iwase .......................... 365/104
5,561,624  10/1996  Chen et al. .................... 365/104

FOREIGN PATENT DOCUMENTS 644778  2/1994  Japan .

*Primary Examiner*—David C. Nelms
*Assistant Examiner*—Huan Hoang

[57] ABSTRACT

When a data bit is read out from a semiconductor read only memory device, a current-mirror type sense amplifier is electrically connected through a bit line, a first selector, a selected memory cell and a second selector to a discharging line so as to check a potential drop on the bit line, and each of the first and second selectors selectively connects the bit line or the discharging line to eight columns of memory cells by increasing the component switching transistors thereof so as to space the bit line from the discharging line, thereby increasing a margin for a bit line contact.

7 Claims, 4 Drawing Sheets

SEMICONDUCTOR MEMORY DEVICE HAVING BIT LINES WIDELY SPACED WITHOUT SACRIFICE OF NARROW PITCH OF SOURCE/DRAIN LINES OF MEMORY CELLS

FIELD OF THE INVENTION

This invention relates to a semiconductor memory device and, more particularly, to a semiconductor memory device having bit lines widely spaced for bit line contacts without sacrifice of a narrow pitch of source/drain lines of memory cells.

DESCRIPTION OF THE RELATED ART

A typical example of the semiconductor read only memory device is illustrated in FIG. 1. The prior art semiconductor read only memory device is fabricated on a semiconductor substrate (not shown), and a plurality of memory cells are incorporated in the prior art semiconductor read only memory device. The plurality of memory cells are divided into memory cell sub-arrays, and the memory cell sub-arrays form in combination a memory cell array 1. The memory cells of each memory cell sub-array are arranged in rows and columns, and FIG. 1 illustrates one of the memory cell sub-arrays 1a.

The plurality of memory cells have the MOS (Metal-Oxide-Semiconductor) structure. A plurality of n-type impurity regions BB1–BB7 formed in the semiconductor substrate, gate insulating layers (not shown) formed on channel regions between the n-type impurity regions BB1–BB7 and word lines WL1 to WL16 extending over the gate insulating layers form the memory cells incorporated in the memory sub-array 1a. The plurality of n-type impurity regions BB1 to BB7 extend in parallel to one another, and are repeated at pitch ranging between 0.6 micron to 0.8 micron. Every two adjacent n-type impurity regions provide source/drain regions for a column of memory cells, and a portion of the semiconductor substrate between the adjacent n-type impurity regions serve as channel regions of the column of memory cells.

Dopant impurity is selectively introduced into the channel regions, and each of the memory cells has either high or low threshold. If a memory cell has the high threshold, the associated word line at a read-out potential level does not generate a conductive channel in the channel region, and the memory cell is maintained in the off-state. On the other hand, if a memory cell has the low threshold, the associated word line at the read-out potential level generates a conductive channel in the channel region, and allows the memory cell to turn on. The high threshold and the low threshold are corresponding to a data bit of logic "1" level and a data bit of logic "0" level, and the data bits are respectively written into the memory cells of the memory cell array 1 through the channel doping.

The prior art semiconductor read only memory device further comprises two selector units 3 and 4. The first selector unit 3 is coupled between the metal bit lines and the memory cell sub-array 1a, and a current source (not shown) selectively supplies current through the metal bit lines and the first selector 3 to the memory cell sub-array 1a. Thus, the first selector 3 provides a current path from the metal bit lines to the memory cell sub-array 1a.

The first selector 3 is enabled with an enable signal selectively supplied to bank selecting lines, and selectively connects each metal bit line to the impurity regions BB1, BB3–BB5 and BB7. The first selector 3 includes first n-channel enhancement type switching transistors directly connected between the metal bit lines and selected impurity regions and second n-channel enhancement type switching transistors connected between the first n-channel enhancement type switching transistors and the other impurity regions. The first n-channel enhancement type switching transistors are gated by the bank selecting lines, and the second n-channel enhancement type switching transistors are gated by the bit line selecting lines. Therefore, each metal bit line is directly connected through the first n-channel enhancement type switching transistor to a selected impurity region or through the first and second n-channel enhancement type switching transistors to a selected impurity region.

FIG. 1 shows only one of the metal bit lines MBL, one of the first n-channel enhancement type switching transistor Qn1 associated with the metal bit line MBL and the second n-channel enhancement type switching transistors Qn2, Qn3, Qn4, Qn5 two of which, i.e., Qn3 and Qn4 are associated with the first n-channel enhancement type switching transistor Qn1. The first n-channel enhancement type switching transistor Qn1 is connected between the metal bit line MBL and the impurity region BB4, and the second n-channel enhancement type witching transistors Qn3 and Qn4 are connected between the first n-channel enhancement type switching transistor Qn1 and the impurity regions BB3/BB5. The impurity regions BB3 and BB5 are electrically connectable through the memory cells M1 and M2 to the impurity regions BB2 and BB6, and the current selectively flows from the metal bit line MBL to the impurity regions BB2 to BB6. The impurity regions BB2 to BB6 and the word lines WL1 to WL16 defines a memory cell group consisting of the memory cells M1 to M2, . . . and M3 to M4.

The second selector 4 is enabled with ground selecting lines, and is responsive to bit selecting lines for selectively connecting the impurity regions to metal virtual ground lines. The second selector 4 provides a current path from the memory cell sub-array 1 to the metal virtual ground lines, and the metal bit lines are electrically connected through the first selector 3, the memory cell sub-array 1a and the second selector 4 to the metal virtual ground lines.

Two metal virtual ground lines MGL1 and MGL2 are associated with the memory cell group M1 to M4 and, accordingly, the metal bit line MBL. Although the metal virtual ground lines MGL1 and MGL2 are shared between the memory cell group M1 to M4 and adjacent memory cell groups, the metal virtual ground lines MGL1 and MGL2 are hereinbelow described as if they are exclusively associated with the memory cell group M1 to M4.

The second selector 4 includes third n-channel enhancement type switching transistors selectively enabled with an enable signal on ground selecting lines and fourth n-channel enhancement type switching transistors gated by other bit line selecting lines. The memory cell group M1 to M4 relates to the third n-channel enhancement type switching transistors Qn6 and Qn7 and the fourth n-channel enhancement type switching transistors Qn9 and Qn10, and the third n-channel enhancement type switching transistors Qn6 and Qn7 and the fourth n-channel enhancement type switching transistors Qn9 and Qn10 are respectively gated by the ground selecting line GS and the bit line selecting line BS2. The third n-channel enhancement type switching transistors Qn6 and Qn7 are respectively connected between the impurity regions BB2/BB6 and the metal virtual ground lines MGL1/MGL2, and the fourth n-channel enhancement type switching transistors Qn9/Qn10 are respectively connected between the impurity regions BB3/BB5 and the third n-channel enhancement type switching transistors Qn6/Qn7.

The metal bit line MBL and the metal virtual ground lines MGL1 and MGL2 are formed over the memory cell array 1 and the first to fourth n-channel enhancement type switching transistors Qn1 to Qn11, and are connected through contact holes CT1, CT2 and CT3 formed in an inter-level insulating layer (not shown) to the n-channel enhancement type switching transistors Qn1, Qn10 and Qn11. The metal virtual ground lines MGL1 and MGL2 are provided on both sides of the metal bit line MBL, and are repeated at pitch twice as wide as the pitch of the impurity regions BB1–BB7. Therefore, the pitch for the metal bit/ground lines MGL1/MBL/MGL2 ranges from 1.2 microns to 1.6 microns.

Assuming now a read-out cycle starts to read out a data bit from one of the memory cells labeled with "M1", the bank selecting line BS and the bit line selecting line BS1 are changed to the active high level, and the first n-channel enhancement type switching transistor Qn1 and the second n-channel enhancement type switching transistors Qn2–Qn5 turn on. However, the bit line selecting line BS2 remains inactive, and the fourth n-channel enhancement type switching transistors Qn8 to Qn11 are turned off. Only the second n-channel enhancement type switching transistor Qn3 relates to the access to the data bit stored in the memory cell M1, and, for this reason, the other second n-channel enhancement type switching transistors Qn2, Qn4 and Qn5 are ignored in the following description.

The first and second n-channel enhancement type switching transistors Qn1 and Qn3 provide a current path from the metal bit line MBL to the impurity region BB3, and the memory cell M1 is provided between the impurity region BB3 and the impurity region BB2. The impurity region BB2 is directly connected to the third n-channel enhancement type switching transistor Qn6 without any fourth n-channel enhancement type switching transistor.

The ground selecting line GS is changed to the active high level, and allows the third n-channel enhancement type switching transistors Qn6 and Qn7 to turn on. The third n-channel enhancement type switching transistor Qn6 provides a current path from the impurity region BB2 to the metal virtual ground line MGL1. Thus, an electrical connection between the metal bit line MBL and the metal virtual ground line MGL1 is dependent on the threshold of the memory cell M1 between the impurity regions BB3 and BB2.

The word line WL1 is changed to the read-out potential level, and each of the memory cells coupled thereto turns on or off depending upon the threshold representing the data bit stored therein. If the memory cell M1 stores the data bit of logic "1" level, the memory cell M1 is turned off, and the metal bit line MBL is electrically isolated from the metal virtual ground line MGL1. The memory cell M1 maintains the potential level on the metal bit line MBL, and a sense amplifier (not shown) determines the data bit stored in the memory cell to be logic "1" level.

On the other hand, if the data bit stored in the memory cell M1 is in logic "0" level, the memory cell M1 has the low threshold, and the word line WL1 at the active high level causes the memory cell M1 to turn on. Then, the metal bit line MBL is electrically connected through the first and second n-channel enhancement type switching transistors Qn1/Qn3, the impurity region BB3, the memory cell M1, the impurity region BB2 and the third n-channel enhancement type switching transistor Qn6 to the metal virtual ground line MGL1. As a result, the potential level at the metal bit line MBL is decayed toward the ground level. The sense amplifier (not shown) determines the data bit stored in the memory cell M1 to be logic "0" level.

A column of memory cells occupies an extremely narrow area between the adjacent two impurity regions, and, accordingly, the manufacturer enhances the integration density of the memory cells incorporated in the prior art semiconductor read only memory device. However, a problem is encountered in the prior art semiconductor read only memory device in that the gap between the metal virtual ground lines MGL1/MGL2 is too narrow to form the contact hole CT1. The difficulty sets a limit on the further development of the integration density.

SUMMARY OF THE INVENTION

It is therefore an important object of the present invention to provide a semiconductor read only memory device which has bit lines and discharging lines arranged at a pitch large enough to form contact holes to component transistors of a selector.

To accomplish the object, the present invention proposes to branch a bit line to columns of memory cells through more than two groups of switching transistors.

In accordance with the present invention, there is provided a semiconductor memory device fabricated on a semiconductor substrate, comprising: a memory cell array having a plurality of memory cell groups each including a plurality of memory cells respectively storing data bits and arranged in rows and columns, the columns of memory cells of each memory cell group being formed between a plurality of conductive lines extending in parallel to one another; a plurality of word lines associated with the memory cell array, and respectively connected to the rows of memory cells for selectively accessing the data bits stored therein; a plurality of bit lines respectively associated with the plurality of memory cell groups, and extending over the memory cell array, one of the plurality of bit lines being associated with the aforesaid each memory cell group; a plurality of discharging lines selectively associated with the plurality of memory cell groups, and extending over the memory cell array, two of the plurality of bit lines being associated with the aforesaid each memory cell group; a first selector connected between the plurality of bit lines and the memory cell array, and including a plurality of first selecting units respectively associated with the plurality of memory cell groups, one of the plurality of first selecting units being connected between the aforesaid one of the plurality of bit lines and the aforesaid each memory cell group so as to cause a current to flow from the aforesaid one of the plurality of bit lines to the aforesaid each memory cell group, the aforesaid one of the plurality of first selecting units including a plurality of selecting sub-units for forming a first current path from the aforesaid one of the plurality of bit lines to two of the plurality of conductive lines of the aforesaid each memory cell group, the plurality of selecting sub-units having a first selecting sub-unit responsive to a first control signal line so as to provide a first conductive path for the current, a second selecting sub-unit responsive to a second control signal line so as to provide a second conductive path for the current, and a third selecting sub-unit responsive to a third control signal line so as to provide a third conductive path for the current; and a second selector connected between the memory cell array and the plurality of discharging lines, and including a plurality of second selecting units respectively associated with the plurality of memory cell groups, one of the plurality of second selecting units being connected between the aforesaid each memory cell group and the aforesaid two of the plurality of discharging lines so as to cause the current to flow from the aforesaid each memory cell group to the aforesaid two of the plurality of discharging lines, the aforesaid one of the plurality of second selecting units including a plurality of other selecting sub-units for forming a second current path from the aforesaid two of the plurality of conductive lines of the each memory cell group to the aforesaid two of the plurality of discharging lines, the plurality of other selecting sub-units having a fourth selecting sub-unit responsive to a fourth control signal line so as to provide a fourth conductive path for the current, a fifth selecting sub-unit responsive to a fifth control signal line so as to provide a fifth conductive path for the current, and a sixth selecting sub-unit responsive to a sixth control signal line so as to provide a sixth conductive path for the current, conductive paths selected from the first to sixth conductive paths forming the first and second current paths.

BRIEF DESCRIPTION OF THE DRAWINGS

The features and advantages of the semiconductor read only memory device according to the present invention will be more clearly understood from the following description taken in conjunction with the accompanying drawings in which.

DESCRIPTION OF THE PREFERRED EMBODIMENTS

First Embodiment

Figure 1:
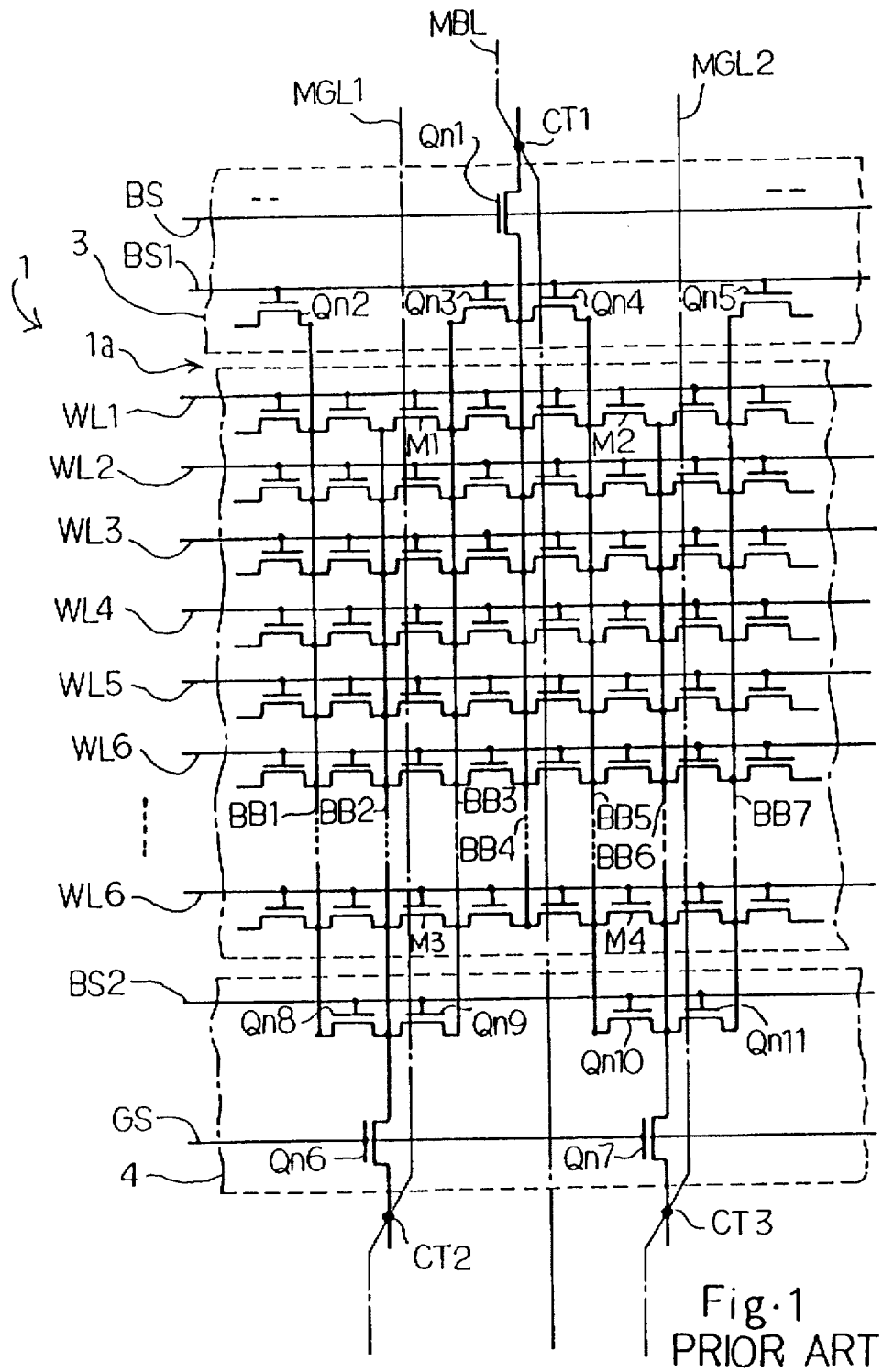
FIG. 1 is a circuit diagram showing the circuit arrangement of the prior art semiconductor read only memory device.
Figure 2:
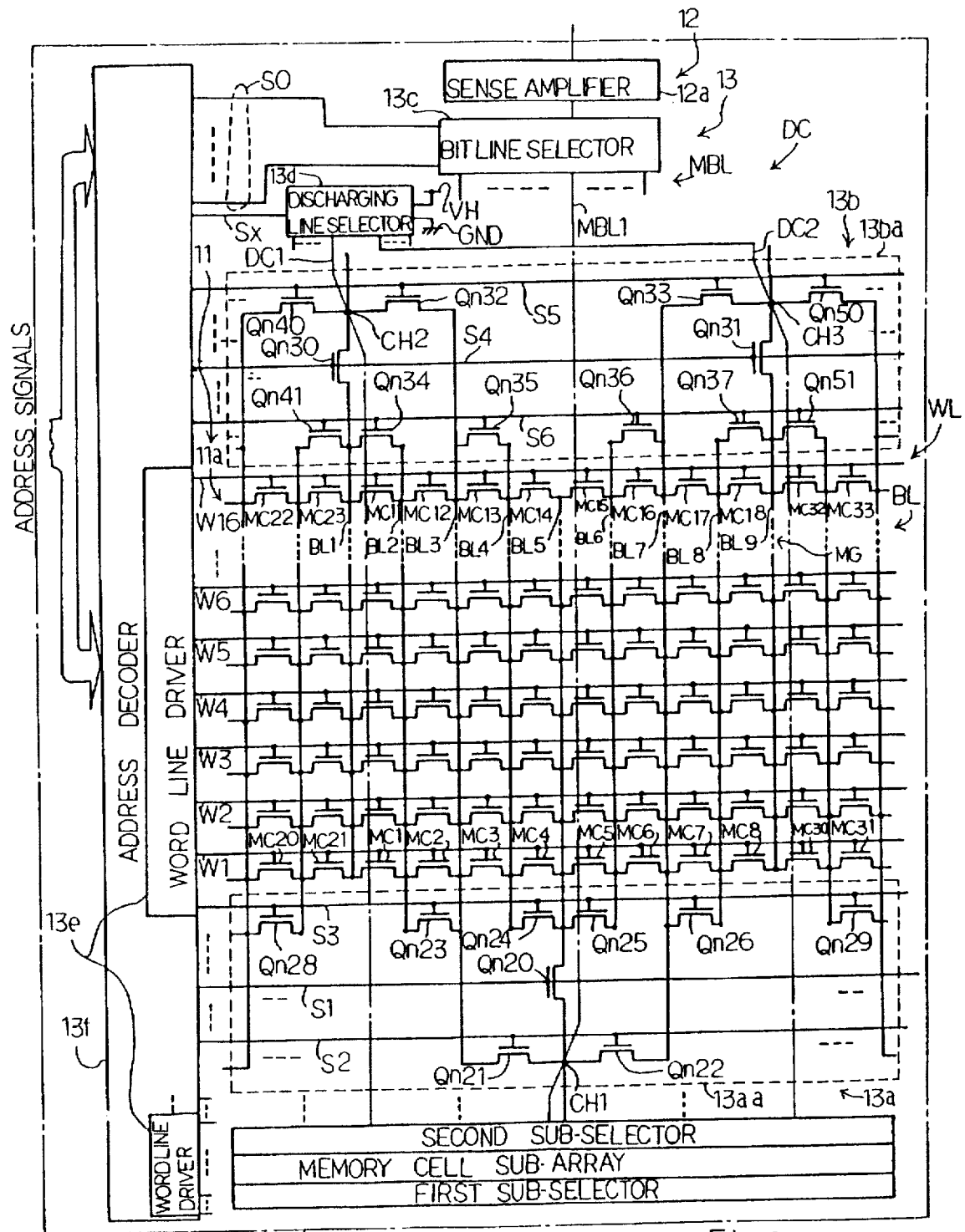
FIG. 2 is a circuit diagram showing the circuit arrangement of a semiconductor read only memory device according to the present invention.

Referring to FIG. 2 of the drawings, a semiconductor read only memory device embodying the present invention is fabricated on a semiconductor substrate 10. The semiconductor read only memory device largely comprises a memory cell array 11, a data read-out system 12 and an addressing system 13. These are hereinbelow described in detail.

The memory cell array 11 is similar in arrangement to the memory cell array 1 of the prior art semiconductor read only memory device. In detail, a plurality of memory cells form the memory cell array 11, and are divided into memory cell sub-arrays. The memory cells of each memory cell sub-array are arranged in rows and columns, i.e., a matrix, and a part of the matrix or the memory cell sub-array 11a is shown in FIG. 2. Description is hereinbelow focused on the memory cell sub-array 11a, because the other memory cell sub-arrays are analogous to the memory cell sub-array 11a.

N-type impurity regions BL are formed in the semiconductor substrate 10, and extend in parallel to one another at intervals. Channel regions take place between the n-type impurity regions, and the channel regions are respectively covered with gate insulating layers. Word lines WL are formed over the gate insulating layers at intervals, and extend in the perpendicular direction to the n-type impurity regions BL. Each column of memory cells is constituted by adjacent two n-type impurity regions, the gate insulating layer on the channel region therebetween and gate electrodes forming parts of the word lines WL over the channel regions.

Thus, the memory cells have a MIS (Metal-Insulator-Semiconductor) structure, and respectively store data bits in the form of different threshold.

In FIG. 2, only nine n-type impurity regions are labeled with BL1 to BL9, and the word lines W1 to W16 are associated with the rows of memory cells incorporated in the memory cell sub-array 11a. The memory cells MC1 to MC8 are concurrently gated by the word line W1, and the word line W16 concurrently controls the memory cells MC11 to MC18. The n-type impurity regions BL1 to BL9 provide the source and drain regions of the memory cells MC1 to MC8, ... and MC11 to MC18. The memory cells MC1–MC8 to MC11–MC18 form a memory cell group MG, and the memory cell group MG form the memory cell sub-array 11a together with other memory cell groups arranged on both sides of the memory cell group MG. Memory cells MC20, MC21, MC22 and MC23 are incorporated in the memory cell group on the left side of the memory cell group MG, and memory cells MC30, MC31, MC32 and MC33 form parts of the memory cell group on the right side of the memory cell group MG.

The data read-out system 12 includes a plurality of bit lines MBL, a plurality of discharging lines DC and a sense amplifier 12a selectively connectable to the bit lines MBL. The discharging lines DC form a plurality of pairs of discharging lines DC1/DC2. Though not shown in FIG. 2, the memory cells 11 are covered with an inter-level insulating layer (not shown), and the bit lines MBL and the discharging lines DC extend on the inter-level insulating layer.

The memory cell group MG is associated with one of the bit line MBL1 and one of the pairs of the discharging lines DC1/DC2, and the discharging lines DC1/DC2 are shared with the adjacent memory cell groups on both sides of the memory cell group MG.

The sense amplifier 12a selectively supplies current to the n-type impurity regions BL through the addressing system 13, and may be implemented by a current mirror circuit. The discharging lines DC are selectively connected to a source of high voltage level VH and a source of ground level GND through the addressing system 13. The behavior of the addressing system 13 will be described hereinlater.

The addressing system 13 includes a first selector 13a coupled between the bit lines MBL and the memory cell array 11, a second selector 13b coupled between the memory cell array 11 and the discharging lines DC, a bit line selector 13c coupled between the bit lines MBL and the sense amplifier 12a and a discharging line selector 13d connected between the discharging lines DC and the sources of high voltage/ground voltage VH/GND. The first selector 13a and the second selector 13b are divided into a plurality of first sub-selectors and a plurality of second sub-selectors, respectively as similar to the memory cell sub-arrays, and the memory cell sub-array 11a is associated with a first sub-selector 13aa and a second sub-selector 13ba. The first sub-selectors are similar to one another, and the second sub-selectors are also similar to one another. For this reason, description is made on the first sub-selector 13aa and the second sub-selector 13ba, only.

The bit line selector 13c is connected between the bit lines MBL and the sense amplifier 12a, and is responsive to address decoded signal lines S0 representative of one of the bit lines MBL so as to selectively couple the bit lines MBL to the sense amplifier 12a. When the bit line selector 13c selects one of the bit lines MBL, the current is supplied from the sense amplifier 12a through the bit line selector 13c to the selected bit line MBL.

The discharging line selector 13d is also responsive to an address decoded signal line Sx so as to selectively connect the discharging lines DC1 and the other discharging lines DC2 to the source of high voltage level VH and the source of ground voltage GND. The grounded discharging lines DC1 or DC2 allow the current to flow from the selected bit line through the first selector 13a and the memory cell array 11 and the second selector 13b thereto; however, not current flows into the other discharging lines DC2/DC1 connected to the source of high voltage level HV.

The first sub-selector 13aa includes a plurality of first n-channel enhancement type switching transistors Qn20 respectively associated with the bit lines MBL, a plurality of pairs of second n-channel enhancement type switching transistors Qn21/Qn22 respectively associated with the bit lines MBL and a plurality of groups of third n-channel enhancement type switching transistors Qn23/Qn24/Qn25/Qn26 respectively associated with the sets of first and second n-channel enhancement type switching transistors Qn20/Qn21/Qn22.

Description is focused on the bit line MBL1 and, accordingly, the memory cell group MG, and, for this reason, a set of first to third n-channel enhancement type switching transistors associated with the bit line MBL1 is described in detail hereinbelow. An n-channel enhancement type switching transistor Qn28 is incorporated in another set of first to third n-channel enhancement type switching transistors for the memory cell group on the left side of the memory cell group MG, and an n-channel enhancement type switching transistor Qn29 forms a part of yet another set of first to third n-channel enhancement type switching transistors for the memory cell group on the right side of the memory cell group MG.

The bit line MBL1 is connected through a contact hole CH1 formed in the inter-level insulating layer (not shown) to the first n-channel enhancement type switching transistor Qn20, and the first n-channel enhancement type switching transistor Qn20 is connected between the contact hole CH1 and the impurity region BL5. The first n-channel enhancement type switching transistor Qn20 is gated by an address decoded signal line S1. Therefore, when the impurity region BL5 is selected from the memory cell group MG, the address decoded signal line S1 causes the first n-channel enhancement type switching transistor Qn20 to turn on, and the metal bit line MBL1 is electrically connected to the impurity region BL5.

The second n-channel enhancement type switching transistors Qn21/Qn22 are connected between the bit line MBL1 and the impurity regions BL3 and BL7, and are gated by an address decoded signal line S2. When the address decoded signal selects one of the impurity regions BL3 and BL7, the address decoded signal line S2 causes the second n-channel enhancement type switching transistors Qn21 and Qn22 to turn on, and the bit line MBL1 is electrically connected through the second n-channel enhancement type switching transistors Qn21/Qn22 to the impurity regions BL3 and BL7.

The third n-channel enhancement type switching transistors Qn23 and Qn26 are connected between the second n-channel enhancement type switching transistors Qn21/Qn22 and the impurity regions BL2/BL8, and the other third n-channel enhancement type switching transistors Qn24 and Qn25 are connected between the first n-channel enhancement type switching transistor Qn20 and the impurity regions BL4/BL6. The third n-channel enhancement type switching transistors Qn23 to Qn26 are gated by an address decoded signal line S3. When the address signal is indicative of one of the impurity regions BL2, BL4, BL6 and BL8, the address decoded signal line S3 is changed to an active high level, and the impurity regions BL2/BL4, BL6/BL8 are electrically connected through the third n-channel enhancement type switching transistors Qn23 to Qn26 and the first/second n-channel enhancement type switching transistors Qn20–Qn21 to the bit line MBL1.

Thus, the first sub-selector 13aa is controlled by the address decoded signal lines S1 to S3 so as to not only select the memory cell sub-array 11a from the memory cell array 11 but also selectively connect each metal bit line to the impurity regions of the associated memory cell group.

The second sub-selector 13ba includes a plurality of pairs of fourth n-channel enhancement type switching transistors Qn30/Qn31 respectively associated with the pairs of discharging lines such as DC1/DC2, a plurality of pairs of fifth n-channel enhancement type switching transistors Qn32/Qn33 respectively associated with the pairs of discharging lines and a plurality of groups of sixth n-channel enhancement type switching transistors Qn34/Qn35/Qn36/Qn37 respectively associated with the sets of fourth and fifth n-channel enhancement type switching transistors Qn30 to Qn33.

Although the set of fourth to sixth n-channel enhancement type switching transistors Qn30 to Qn37 are provided for each of the other memory cell groups, description is focused on the fourth to sixth n-channel enhancement type switching transistors Qn30 to Qn37 associated with the pair of discharging lines DC1/DC2 and, accordingly, the memory cell group MG. N-channel enhancement type switching transistors Qn40 and Qn41 form parts of another set of fourth to sixth n-channel enhancement type switching transistors associated with the memory cell group on the left side of the memory cell group MG, and n-channel enhancement type switching transistors Qn50 and Qn51 are incorporated in yet another set of fourth to sixth n-channel enhancement type switching transistors provided for the memory cell group on the right side of the memory cell group MG.

The discharging lines DC1 and DC2 are connected through contact holes CH2/CH3 formed in the inter-level insulating layer (not shown) to the fourth n-channel enhancement type switching transistors Qn30 and Qn31, and the impurity regions BL1 and BL9 are respectively connected to the fourth n-channel enhancement type switching transistors Qn30 and Qn31. The fourth n-channel enhancement type switching transistors Qn30/Qn31 are gated by an address decoded signal line S4. Therefore, when one of the impurity regions BL1 and BL9 is selected from the memory cell group MG, the address decoded signal on the address decoded signal line S4 causes the fourth n-channel enhancement type switching transistors Qn30 and Qn31 to turn on, and the impurity regions BL1/BL9 are electrically connected to the discharging lines DC1/DC2. As described in conjunction with the discharging line selector 13d, the discharging lines DC1 and DC2 are selectively connected to the source of high voltage level VH and the source of ground level GND, and the current flows from the bit line MBL1 through either impurity region BL1/BL9 to the source of ground level.

The fifth n-channel enhancement type switching transistors Qn32/Qn33 are connected between the impurity regions BL3 and BL7 and the discharging lines DC1/DC2, and are gated by an address decoded signal line S5. When the address decoded signal selects one of the impurity regions BL3 and BL7, the decoded signal line S2 causes the fifth n-channel enhancement type switching transistors Qn32 and Qn33 to turn on, and the impurity regions BL3/BL7 are electrically connected through the fifth n-channel enhancement type switching transistors Qn32/Qn33 to the discharging lines DC1 and DC2. The discharging line selector 13d connects one of the discharging lines DC1/DC2 to the source of ground level GND, and, accordingly, the current flows through either impurity region BL3/BL7 to the source of ground level GND.

The sixth n-channel enhancement type switching transistors Qn34 and Qn37 are connected between the impurity regions BL2/BL8 and the fourth n-channel enhancement type switching transistors Qn30/Qn31, and the other sixth n-channel enhancement type switching transistors Qn35 and Qn36 are connected between the impurity regions BL2/BL4 and the fifth n-channel enhancement type switching transistors Qn32/Qn33. The sixth n-channel enhancement type switching transistors Qn34 to Qn37 are gated by an address decoded signal line S6. When the address signal is indicative of one of the impurity regions BL2/BL4/BL6/BL8, the address decoded signal line S6 is changed to the active high level, and the impurity regions BL2/BL4/BL6/BL8 are electrically connected to the fourth and fifth n-channel enhancement type switching transistors Qn30 to Qn33. Either fourth or fifth n-channel enhancement type switching transistors Qn30/Qn31 or Qn32/Qn33 turn on, and selected one of the impurity regions BL2/BL4/BL6/BL8 is electrically connected to the discharging line DC1/DC2 grounded through the discharging line decoder 13d.

Thus, the second sub-selector 13aa is controlled by the address decoded signal lines S4 to S6 so as to selectively connect one of the impurity regions BL1 to BL4 and BL6–BL9 to the grounded discharging line DC1 or DC2.

The addressing system 13 further includes word line drivers 13e connected to the word lines WL and an address decoder 13f connected to the address decoded signal lines S0 to Sx and the word line drivers 13e. Address signals are representative of an address assigned to one of the memory cells, and are supplied to the address decoder 13f. The address decoder 13f selectively drives the address decoded signal lines S0 to Sx, and causes the word line drivers 13e to selectively drive the word lines WL. Thus, the addressing system 13, i.e., the address decoder 13f, word line drivers 13e, the bit line selector 13c, the first selector 13a, the second selector 13b and the discharging line selector 13d selects one of the memory cells represented by the address signals.

The first sub-selector 13aa and the second sub-selector 13ba selectively connects the associated bit line MBL1 and the discharging lines DC1/DC2 to the eight columns of memory cells. Even if the impurity regions BL1 to B19 are arranged at the same pitch as those of the prior art semiconductor read only memory device, the discharging lines DC1/DC2 are widely spaced from one another rather than the prior art semiconductor read only memory device, and the wide gap between the discharging lines DC1/DC2 allows a manufacturer to form the contact hole CH1 without a short-circuit to the discharging line DC1/DC2. Thus, the semiconductor read only memory device shown in FIG. 2 provides a large margin for the contact hole CH1, and the manufacturer can decrease the pitch of the impurity regions BL, thereby further increasing the integration density of the memory cells.

Description is hereinbelow made on a data access to the memory cells MC1 to MC4.

When the address signals are representative of the address assigned to the memory cell MC1, the address decoder 13f causes the bit line selector 13c to connect the sense amplifier 12a to the bit line MBL1, and instructs the discharging line selector 13d to connect the discharging lines DC1 to the source of ground level GND through the address decoded signal line Sx.

The address decoder 13f further changes the address decoded signal lines S2, S3 and S4 to the active high level, and the address decoded signal lines S1, S5 and S6 are maintained in the inactive low level. The address decoded signal lines S2 and S3 cause the second n-channel enhancement type switching transistors Qn21/Qn22 and the n-channel enhancement type switching transistors Qn23 to Qn26 to turn on. However, the first n-channel enhancement type switching transistor Qn20 is turned off so as to isolate the impurity regions BL4 to BL6 from the bit line MBL1. Thus, only the impurity regions BL2, BL3, BL7 and BL8 are electrically connected to the bit line MBL1 and, accordingly, the sense amplifier 12a.

On the other hand, the address decoded signal lines S4 causes the fourth n-channel enhancement type switching transistors Qn30/Qn31 to turn on so as to connect the impurity regions BL1 and BL9 to the discharging lines DC1/DC2, respectively. However, the address decoded signal lines S5 and S6 maintain the fifth and sixth n-channel enhancement type switching transistors Qn32 to Qn37 in the off-state, and the other impurity regions BL2 to BL8 are electrically isolated from the discharging lines DC1/DC2.

The address decoder 13f causes the word line driver 13e to change the word line W1 to a read-out potential level. The read-out potential level is regulated to the high threshold and the low threshold, and the memory cells MC20, MC21, MC1 to MC8, MC30 and MC31 selectively turn on and off depending upon the data bits stored therein.

The sense amplifier 12a supplies the current through the bit line MBL1 and the second and third n-channel enhancement type switching transistors Qn21/Qn22 and Qn23/Qn26 to the impurity regions BL2/BL8. However, the discharging line DC2 pulls up the impurity region BL8 to the high voltage level equal to or close to the potential level on the selected bit line MBL1, and no current flows between the impurity regions BL8 and BL9.

If the memory cell MC1 stores a data bit of logic "1" level represented by the high threshold, the memory cell MC1 is turned off, and no current flows from the impurity region BL2 to the impurity region BL1. The sense amplifier 12a acknowledges the high potential level on the selected bit line MBL1, and generates an output signal representative of logic "1" level.

On the other hand, if the memory cell MC1 stores a data bit of logic "0" level represented by the low threshold, the memory cell MC1 turns on, and the current flows from the impurity region BL2 to the impurity region BL1. The sense amplifier 12a acknowledges the potential drop on the selected bit line MBL1, and generates the output signal representative of logic "0" level.

When the address signals change the address to the memory cell MC2, the address decoder 13f causes the bit line selector 13c to connect the sense amplifier 12a to the bit line MBL1, and instructs the discharging line selector 13d to connect the discharging lines DC1 to the source of ground level GND through the address decoded signal line Sx.

The address decoder 13f further changes the address decoded signal lines S2, S4 and S6 to the active high level, and the address decoded signal lines S1, S3 and S5 are maintained in the inactive low level. The address decoded signal line S2 causes the second n-channel enhancement type switching transistors Qn21/Qn22 to turn on. However, the first and third n-channel enhancement type switching transistors Qn20 and Qn23 to Qn26 are turned off so as to isolate the impurity regions BL2 BL4, BL5, BL6 and BL8 from the bit line MBL1. Thus, only the impurity regions BL3 and BL7 are electrically connected to the bit line MBL1 and, accordingly, the sense amplifier 12a.

On the other hand, the address decoded signal lines S4 and S6 cause the fourth and sixth n-channel enhancement type switching transistors Qn30/Qn31 and Qn34 to Qn37 to turn on so as to connect the impurity regions BL1, BL2, BL8 and BL9 to the discharging lines DC1/DC2. However, the address decoded signal line S5 maintains the fifth n-channel enhancement type switching transistors Qn32 and Qn33 in the off-state, and the other impurity regions BL3 to BL7 are electrically isolated from the discharging lines DC1/DC2.

The address decoder 13f causes the word line driver 13e to change the word line W1 to the read-out potential level, and the memory cells MC20, MC21, MC1 to MC8, MC30 and MC31 selectively turn on and off depending upon the data bits stored therein.

The sense amplifier 12a supplies the current through the bit line MBL1 and the second n-channel enhancement type switching transistors Qn21/Qn22 to the impurity regions BL3/BL7. However, the discharging line DC2 pulls up the impurity region BL8 to the high voltage level, and no current flows between the impurity regions BL7 and BL8.

If the memory cell MC2 stores the data bit of logic "1" level, the memory cell MC2 is turned off, and no current flows from the impurity region BL3 to the impurity region BL2. The sense amplifier 12a acknowledges the high potential level on the selected bit line MBL1, and generates the output signal representative of logic "1" level.

On the other hand, if the memory cell MC2 stores the data bit of logic "0" level, the memory cell MC1 turns on, and the current flows from the impurity region BL3 to the impurity region BL2. The sense amplifier 12a acknowledges the potential drop on the selected bit line MBL1, and generates the output signal representative of logic "0" level.

When the address signals change the address to the memory cell MC3, the address decoder 13f also causes the bit line selector 13c to connect the sense amplifier 12a to the bit line MBL1, and instructs the discharging line selector 13d to connect the discharging lines DC1 to the source of ground level GND through the address decoded signal line Sx.

The address decoder 13f further changes the address decoded signal lines S1, S3 and S5 to the active high level, and the address decoded signal lines S2, S4 and S6 are maintained in the inactive low level. The address decoded signal lines S1 and S3 cause the first and third n-channel enhancement type switching transistors Qn20 and Qn23 to Qn26 to turn on. However, the second n-channel enhancement type switching transistors Qn21 and Qn22 are turned off so as to isolate the impurity regions BL2 BL3, BL7 and BL8 from the bit line MBL1. Thus, only the impurity regions BL4, BL5 and BL6 are electrically connected to the bit line MBL1 and, accordingly, the sense amplifier 12a.

On the other hand, the address decoded signal line S5 causes the fifth n-channel enhancement type switching transistors Qn32/Qn32 to turn on so as to connect the impurity regions BL3 and BL7 to the discharging lines DC1/DC2. However, the address decoded signal lines S4 and S6 maintain the fourth and sixth n-channel enhancement type switching transistors Qn30/Qn31 and Qn34–Qn37 in the off-state, and the other impurity regions BL1, BL2, BL4, BL5, BL6, BL8 and BL9 are electrically isolated from the discharging lines DC1/DC2.

The address decoder 13f causes the word line driver 13e to change the word line W1 to the read-out potential level, and the memory cells MC20, MC21, MC1 to MC8, MC30 and MC31 selectively turn on and off depending upon the data bits stored therein.

The sense amplifier 12a supplies the current through the bit line MBL1 and the first and third n-channel enhancement type switching transistors Qn20, Qn24 and Qn25 to the impurity regions BL4 to BL6. However, the discharging line DC2 pulls up the impurity region BL7 to the high voltage level, and no current flows between the impurity regions BL6 and BL7.

If the memory cell MC3 stores the data bit of logic "1" level, the memory cell MC3 is turned off, and no current flows from the impurity region BL4 to the impurity region BL3. The sense amplifier 12a acknowledges the high potential level on the selected bit line MBL1, and generates the output signal representative of logic "1" level.

On the other hand, if the memory cell MC3 stores the data bit of logic "0" level, the memory cell MC3 turns on, and the current flows from the impurity region BL4 to the impurity region BL3. The sense amplifier 12a acknowledges the potential drop on the selected bit line MBL1, and generates the output signal representative of logic "0" level.

When the address signals change the address to the memory cell MC4, the address decoder 13f also causes the bit line selector 13c to connect the sense amplifier 12a to the bit line MBL1, and instructs the discharging line selector 13d to connect the discharging lines DC1 to the source of ground level GND through the address decoded signal line Sx.

The address decoder 13f further changes the address decoded signal lines S1, S5 and S6 to the active high level, and the address decoded signal lines S2, S3 and S4 are maintained in the inactive low level. The address decoded signal line S1 causes the first n-channel enhancement type switching transistor Qn20 to turn on. However, the second and third n-channel enhancement type switching transistors Qn21, Qn22 and Qn23 to Qn26 are turned off so as to isolate the impurity regions BL2 to BL4 and BL6 to BL8 from the bit line MBL1. Thus, only the impurity region BL5 is electrically connected to the bit line MBL1 and, accordingly, the sense amplifier 12a.

On the other hand, the address decoded signal lines S4 and S6 cause the fifth and sixth n-channel enhancement type switching transistors Qn32/Qn33 and Qn34 to Qn37 to turn on so as to connect the impurity regions BL3, BL4, BL6 and BL7 to the discharging lines DC1/DC2. However, the address decoded signal line S5 maintains the fourth n-channel enhancement type switching transistors Qn30 and Qn31 in the off-state, and the other impurity regions BL1, BL2, BL8 and BL9 are electrically isolated from the discharging lines DC1/DC2.

The address decoder 13f causes the word line driver 13e to change the word line W1 to the read-out potential level, and the memory cells MC20, MC21, MC1 to MC8, MC30 and MC31 selectively turn on and off depending upon the data bits stored therein.

The sense amplifier 12a supplies the current through the bit line MBL1 and the first n-channel enhancement type switching transistor Qn20 to the impurity region BL5. However, the discharging line DC2 pulls up the impurity region BL6 to the high voltage level, and no current flows between the impurity regions BL5 and BL6.

If the memory cell MC4 stores the data bit of logic "1" level, the memory cell MC4 is turned off, and no current flows from the impurity region BL5 to the impurity region BL4. The sense amplifier 12a acknowledges the high potential level on the selected bit line MBL1, and generates the output signal representative of logic "1" level.

On the other hand, if the memory cell MC4 stores the data bit of logic "0" level, the memory cell MC4 turns on, and the current flows from the impurity region BL5 to the impurity region BL4. The sense amplifier 12a acknowledges the potential drop on the selected bit line MBL1, and generates the output signal representative of logic "0" level.

When the address signals selects one of the other memory cells MC8, MC7, MC6 and MC5 of the memory cell group MG, the address decoder 13f instructs the discharging line selector 13d to couple the discharging line DC2 to the source of ground level GND; however, the address decoded signal lines S1 to S6 are controlled as similar to those of the data access to the memory cells MC1 to MC4. For this reason, no further description is incorporated hereinbelow.

In this instance, the first n-channel enhancement type switching transistor Qn20, the second n-channel enhancement type switching transistors Qn21/Qn22, the third n-channel enhancement type switching transistors Qn23 to Qn26, the fourth n-channel enhancement type switching transistor Qn30, the fifth n-channel enhancement type switching transistors Qn32/Qn33 and the sixth n-channel enhancement type switching transistors Qn34 to Qn37 respectively serve as a first selecting sub-unit, a second selecting sub-unit, a third selecting sub-unit, a fourth selecting sub-unit, a fifth selecting sub-unit and a sixth selecting sub-unit.

As will be understood from the foregoing description, the first and second selectors 13a and 13b widens the pitch between the bit/discharging lines MBL/DC, and the manufacturer can form the contact holes CH1 to CH3 without a short-circuit between the bit lines MBL and the discharging lines DC. In fact, the pitch between the bit line MBL and the discharging line DC is equivalent to the four impurity regions, and is as twice as wide as that of the prior art semiconductor read only memory device. As a result, defective products are drastically decreased, and the productivity is enhanced.

The first and second selectors 13a and 13b are fabricated from the n-channel enhancement type switching transistors more than those of the prior art semiconductor read only memory device. The increase of the component switching transistors results in the address decoded signal lines S1 to S6 more than those of the prior art, an occupation area wider than that of the prior art and reduction of the amount of current passing through the selected memory cell. However, these drawbacks are ignoreable as described hereinbelow.

As to the address decoded signal lines, the prior art memory cell sub-array 1a requires four lines, and the memory cell sub-array 11a has six lines. A standard semiconductor read only memory device assigns sixty-four word lines to each memory cell sub-array. Even if the address decoded signal lines are increased from four to six, the area occupied by those signal lines is only increased at 3 percent, and the increment is ignoreable.

As to the amount of current passing through the selected memory cell, when a memory cell is selected, three n-channel enhancement type switching transistors are serially connected to the selected memory cell in the prior art semiconductor memory device. A selected memory cell of the semiconductor read only memory device according to the present invention is connected to the bit line MBL and the discharging line DC1/DC2 through three n-channel enhancement type switching transistors. Thus, even though the first and second selectors 13a and 13b increase the component transistors, the current flows through the n-channel enhancement type switching transistors equal to those of the prior art selectors 3 and 4, and the potential drop on the selected bit line MBL is large enough to be detested by the sense amplifier 12a.

The first and second selectors 13a and 13b allows a manufacturer to increase the integration density of the memory cell array 11. In general, the bit lines MBL and the discharging lines on the inter-level insulating layer are formed of metal, and the minimum pattern geometry for the metal wirings is wider than that of the impurity regions in the semiconductor substrate. In fact, even though a patterning technology achieves the impurity regions ranging from 0.6 micron to 0.8 micron in width, the metal wirings requires a pattern technology for 1.2 microns to 1.6 microns line width, and the patterning of a metal layer is one of the most difficult technologies in the semiconductor device manufacturing field. In this situation, the first and second selectors 13a and 13b according to the present invention increases the ratio of the bit/discharging line to the impurity regions. This means that even if the pitch of the impurity regions is decreased, the gap between the bit line and the discharging line is still wide enough to form the contact without a short-circuit. The narrow pitch results in an increase of the memory cells without sacrifice of the real estate. Thus, the first and second selectors 13a and 13b according to the present invention allows a manufacturer to increase the integration density of the memory cell-array 11.

Second Embodiment

Figure 3:
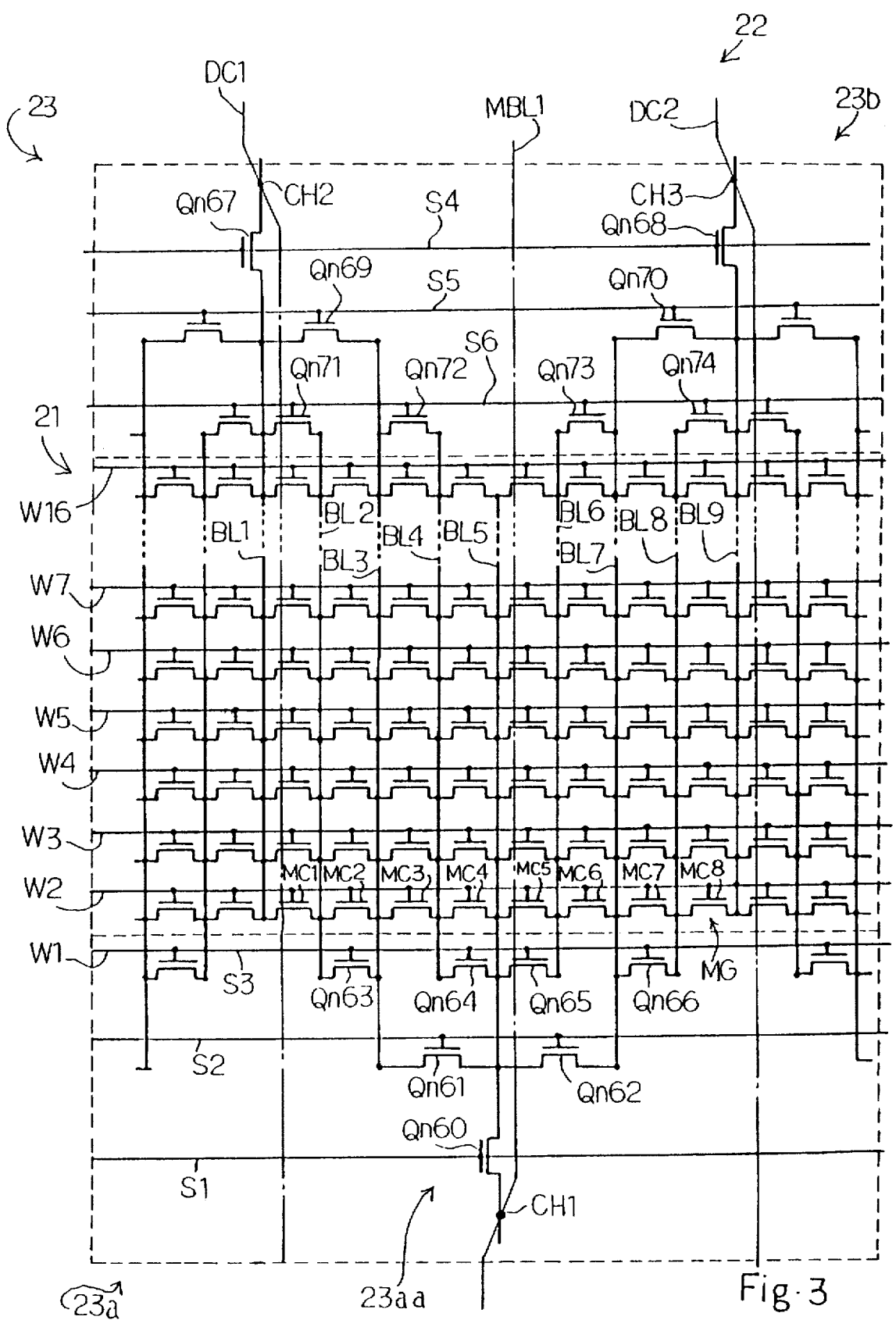
FIG. 3 is a circuit diagram showing the circuit arrangement of another semiconductor read only memory device according to the present invention.

Turning to FIG. 3 of the drawings, another semiconductor read only memory device embodying the present invention is fabricated on a semiconductor substrate (not shown). The semiconductor read only memory device also largely comprises a memory cell array 21, a data read-out system 22 and an addressing system 23. The memory cell array 21 and the data read-out system 22 are similar to those of the first embodiment, and memory cells and data propagation lines are labeled with references designating corresponding transistors and lines of the first embodiment.

The addressing system 23 is further similar to the addressing system 13 except for the arrangement of first and second selectors 23a and 23b, and, for this reason, description is focused on the circuit arrangement of the first and second selectors 23a and 23b for the sake of simplicity.

The first selector 23a has a plurality of first sub-selectors 23aa, and one of the first sub-selectors 23aa is associated with the memory cell group MG. The first sub-selector 23aa includes a first n-channel enhancement type switching transistor Qn60, second n-channel enhancement type switching transistors Qn61 and Qn62 and third n-channel enhancement type switching transistors Qn63 to Qn66. The first n-channel enhancement type switching transistor Qn60 is connected between the bit line MBL1 and the impurity region BL5, and is gated by the address decoded signal line S1. The second n-channel enhancement type switching transistors Qn61 and Qn62 are connected between the first n-channel enhancement type switching transistor Qn60 and the impurity regions BL3/BL7, and are gated by the address decoded signal line S2. The third n-channel enhancement type switching transistors Qn63 to Qn66 are connected between the first and second n-channel enhancement type switching transistors Qn60–Qn62 and the impurity regions BL2, BL4, BL6 and BL8, and are gated by the address decoded signal line S3. The address decoder (not shown) controls the first to third n-channel enhancement type switching transistors Qn60 to Qn66 through the address decoded signal lines S1 to S3, and the first to third n-channel enhancement type switching transistors Qn60 to Qn66 selectively connect the bit line MBL1 to the impurity regions BL2 to BL8.

The second selector 23b also has a plurality of second sub-selectors 23ba, and one of the second sub-selectors 23ba is associated with the memory cell group MG. The second sub-selector 23ba includes fourth n-channel enhancement type switching transistors Qn67/Qn68, fifth n-channel enhancement type switching transistors Qn69 and Qn70 and sixth n-channel enhancement type switching transistors Qn71 to Qn74. The fourth n-channel enhancement type switching transistors Qn67 and Qn68 are connected between the discharging lines DC1/DC2 and the impurity regions BL1/BL9, and are gated by the address decoded signal line S4. The fifth n-channel enhancement type switching transistors Qn69 and Qn70 are connected between the fourth n-channel enhancement type switching transistors Qn67/Qn68 and the impurity regions BL3/BL7, and are gated by the address decoded signal line S5. The sixth n-channel enhancement type switching transistors Qn71 to Qn74 are connected between the fourth and fifth n-channel enhancement type switching transistors Qn67-Qn70 and the impurity regions BL2, BL4, BL6 and BL8, and are gated by the address decoded signal line S6. The address decoder (not shown) controls the fourth to sixth n-channel enhancement type switching transistors Qn67 to Qn74 through the address decoded signal lines S4 to S6, and the fourth to sixth n-channel enhancement type switching transistors Qn67 to Qn74 selectively connect the discharging lines DC1/DC2 to the impurity regions BL1 to BL4 and BL5 to BL8.

Each of the bit/discharging lines MBL1/DC1/DC2 is corresponding to four impurity regions such as BL2 to BL5, and the wide gap between the bit line MBL1 and the discharging line DC1/DC2 allows a contact hole CH1, CH2 or CH3 to provide an electrical connection between the bit/discharging line MBL1/DC1/DC2 and the associated n-channel enhancement type switching transistor Qn60/Qn67/Qn68 without a short-circuit.

When address signals selects the memory cell MC1 from the memory cell array 21, the address decoder (not shown) causes the bit line selector (not shown) and the discharging line selector (not shown) to connect the sense amplifier (not shown) and the source of ground voltage (not shown) to the bit line MBL1 and the discharging line DC1, respectively.

The address decoder (not shown) changes the address decoded signal lines S1 to S3 to the active high level, and the first to third n-channel enhancement type switching transistors Qn60 to Qn66 turn on. Then, the bit line MBL1 is electrically connected through the first to third n-channel enhancement type switching transistors Qn60, Qn61 and Qn63 to the impurity region BL2.

The address decoder (not shown) further changes the address decoded signal line S4 to the active high level, and maintains the other address decoded signal lines S5 and S6 to the inactive low level. Only the fourth n-channel enhancement type switching transistors Qn67/Qn68 turn on so as to connect the discharging lines DC1/DC2 to the impurity regions BL1/BL9.

When the word line driver (not shown) raises the word line W1 to the read-out voltage level, the memory cells MC1 to MC8 selectively turn on and off depending upon the data bits stored therein.

If the memory cell MC1 stores the data bit of logic "1" level, the memory cell MC1 remains off, and the current does not flow into the impurity region BL1. The sense amplifier (not shown) detects the high potential level on the bit line MBL1, and produces the output signal representative of logic "1" level.

On the other hand, if the memory cell MC1 stores the data bit of logic "1" level, the memory cell MC1 turns on, and the current flows from the impurity region BL2 to the impurity region BL1. The sense amplifier (not shown) detects the potential drop on the bit line MBL1, and produces the output signal of logic "0" level.

When the address signals selects another memory cell from the memory cell group MG, the address decoder (not shown) differently controls the address decoded signals S1 to S6, and causes the sense amplifier (not shown) to check the potential level on the bit line MBL1 to see whether or not the current flows through the selected memory cell.

In this instance, the first n-channel enhancement type switching transistor Qn60, the second n-channel enhancement type switching transistors Qn61/Qn62, the third n-channel enhancement type switching transistors Qn63 to Qn66, the fourth n-channel enhancement type switching transistors Qn67/Qn68, the fifth n-channel enhancement type switching transistors Qn69/Qn70 and the sixth n-channel enhancement type switching transistors Qn71 to Qn74 respectively serve as a first selecting sub-unit, a second selecting sub-unit, a third selecting sub-unit, a fourth selecting sub-unit, a fifth selecting sub-unit and a sixth selecting sub-unit.

In this instance, the four n-channel enhancement type switching transistors are connected in serial to a selected memory cell, and slightly restricts the amount of current passing through the selected memory cell. However, the area assigned to the first and second selectors 23a and 23b are wide enough to increase the width of the channel regions of the n-channel enhancement type switching transistors Qn60 to Qn74. For this reason, the potential level on the bit line MBL is widely changed depending upon the data bit stored in the selected memory cell.

Third Embodiment

Figure 4:
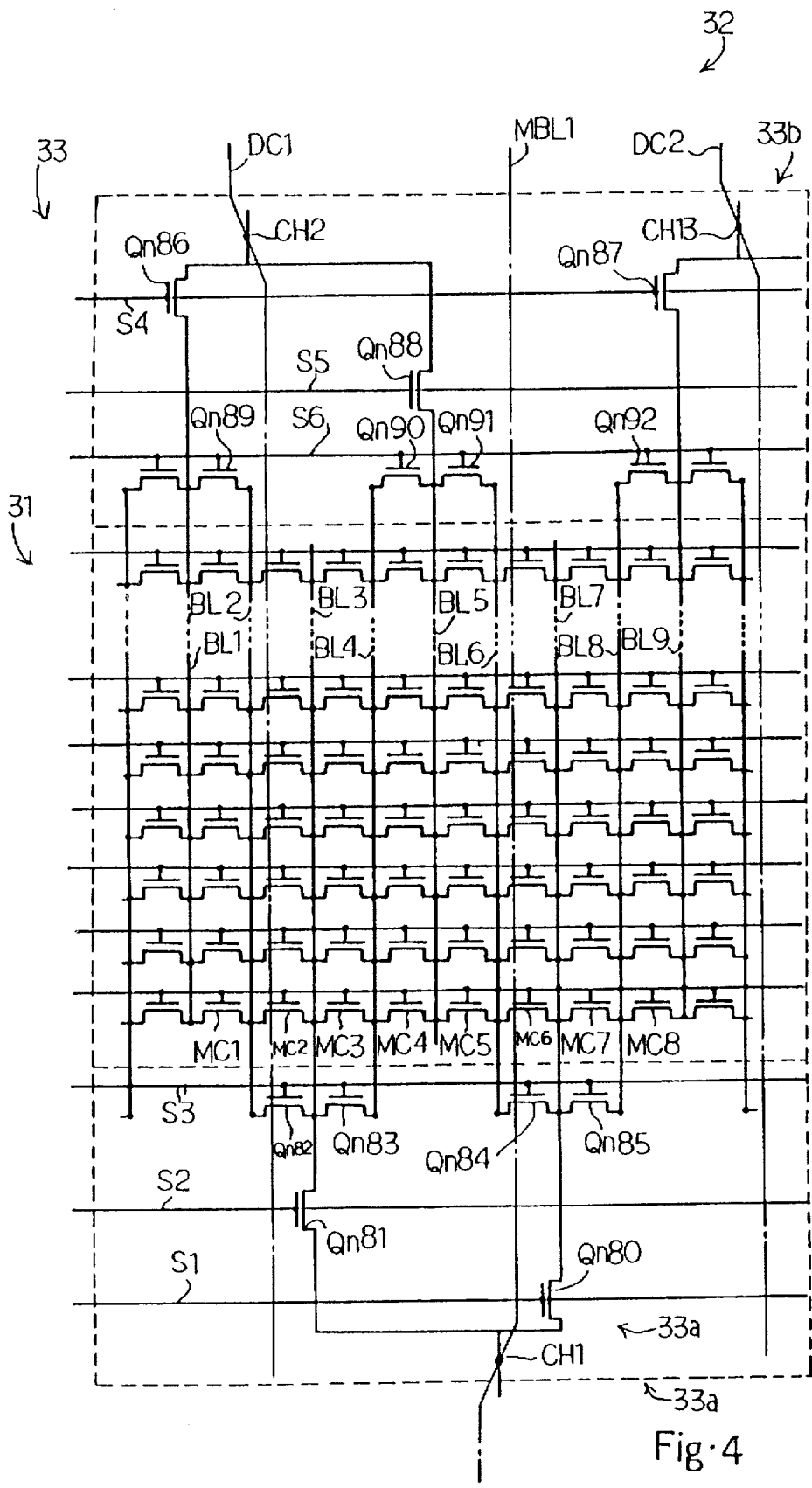
FIG. 4 is a circuit diagram showing the circuit arrangement of yet another semiconductor read only memory device according to the present invention.

Turning to FIG. 4 of the drawings, yet another semiconductor read only memory device embodying the present invention is fabricated on a semiconductor substrate (not shown). The semiconductor read only memory device also largely comprises a memory cell array 31, a data read-out system 32 and an addressing system 33. The memory cell array 31 and the data read-out system 32 are similar to those of the first embodiment, and memory cells and data propagation lines are labeled with references designating corresponding transistors and lines of the first embodiment.

The addressing system 33 is further similar to the addressing system 13 except for the arrangement of first and second selectors 33a and 33b, and, for this reason, description is focused on the circuit arrangement of the first and second selectors 33a and 33b for the sake of simplicity.

The first selector 33a has a plurality of first sub-selectors 33aa, and one of the first sub-selectors 33aa is associated with the memory cell group MG. The first sub-selector 33aa includes a first n-channel enhancement type switching transistor Qn80, a second n-channel enhancement type switching transistors Qn81 and third n-channel enhancement type switching transistors Qn82 to Qn85. The first n-channel enhancement type switching transistor Qn80 is connected between the bit line MBL1 and the impurity region BL7, and is gated by the address decoded signal line S1. The second n-channel enhancement type switching transistor Qn81 is connected between the bit line MBL1 and the impurity region BL3, and is gated by the address decoded signal line S2. The third n-channel enhancement type switching transistors Qn82 to Qn85 are connected between the first and second n-channel enhancement type switching transistors Qn80 and Qn81 and the impurity regions BL2, BL4, BL6 and BL8, and are gated by the address decoded signal line S3. The address decoder (not shown) controls the first to third n-channel enhancement type switching transistors Qn80 to Qn85 through the address decoded signal lines S1 to S3, and the first to third n-channel enhancement type switching transistors Qn80 to Qn85 selectively connect the bit line MBL1 to the impurity regions BL2 to BL4 and BL6 to BL8.

The second selector 33b also has a plurality of second sub-selectors 33ba, and one of the second sub-selectors 33ba is associated with the memory cell group MG. The second sub-selector 33ba includes fourth n-channel enhancement type switching transistors Qn86/Qn87, a fifth n-channel enhancement type switching transistor Qn88 and sixth n-channel enhancement type switching transistors Qn89 to Qn92. The fourth n-channel enhancement type switching transistors Qn86 and Qn87 are connected between the discharging lines DC1/DC2 and the impurity regions BL1/BL9, and are gated by the address decoded signal line S4. The fifth n-channel enhancement type switching transistor Qn88 is connected between the discharging line DC1 and the impurity region BL5, and is gated by the address decoded signal line S5. The sixth n-channel enhancement type switching transistors Qn89 to Qn92 are connected between the fourth and fifth n-channel enhancement type switching transistors Qn86–Qn88 and the impurity regions BL2, BL4, BL6 and BL8, and are gated by the address decoded signal line S6. The address decoder (not shown) controls the fourth to sixth n-channel enhancement type switching transistors Qn86 to Qn92 through the address decoded signal lines S4 to S6, and the fourth to sixth n-channel enhancement type switching transistors Qn86 to Qn92 selectively connect the discharging lines DC1/DC2 to the impurity regions BL1 to BL4 and BL5 to BL8.

Each of the bit/discharging lines MBL1/DC1/DC2 is corresponding to four impurity regions such as BL3 to BL6, and the wide gap between the bit line MBL1 and the discharging line DC1/DC2 allows a contact hole CH1, CH2 or CH3 to provide an electrical connection between the bit/discharging line MBL1/DC1/DC2 and the associated n-channel enhancement type switching transistor Qn80/Qn81/Qn86/Qn87 without a short-circuit. Moreover, three n-channel enhancement type switching transistors are coupled in series to a selected memory cell, and the potential level on the bit line is widely changed without enlargement of the n-channel enhancement type switching transistors Qn80 to Qn92.

When address signals selects the memory cell MC1 from the memory cell array 31, the address decoder (not shown) causes the bit line selector (not shown) and the discharging line selector (not shown) to connect the sense amplifier (not shown) and the source of ground voltage (not shown) to the bit line MBL1 and the discharging line DC1, respectively.

The address decoder (not shown) changes the address decoded signal lines S2 and S3 to the active high level, and the second to third n-channel enhancement type switching transistors Qn81 to Qn85 turn on. Then, the bit line MBL1 is electrically connected through the second and third n-channel enhancement type switching transistors Qn81 and Qn82 to the impurity region BL2.

The address decoder (not shown) further changes the address decoded signal line S4 to the active high level, and maintains the other address decoded signal lines S5 and S6 to the inactive low level. Only the fourth n-channel enhancement type switching transistors Qn86/Qn87 turn on so as to connect the discharging lines DC1/DC2 to the impurity regions BL1/BL9.

When the word line driver (not shown) raises the word line W1 to the read-out voltage level, the memory cells MC1 to MC8 selectively turn on and off depending upon the data bits stored therein.

If the memory cell MC1 stores the data bit of logic "1" level, the memory cell MC1 remains off, and the current does not flow into the impurity region BL1. The sense amplifier (not shown) detects the high potential level on the bit line MBL1, and produces the output signal representative of logic "1" level.

On the other hand, if the memory cell MC1 stores the data bit of logic "0" level, the memory cell MC1 turns on, and the current flows from the impurity region BL2 to the impurity region BL1. The sense amplifier (not shown) detects the potential drop on the bit line MBL1, and produces the output signal of logic "0" level.

When the address signals selects another memory cell from the memory cell group MG, the address decoder (not shown) differently controls the address decoded signals S1 to S6, and causes the sense amplifier (not shown) to check the potential level on the bit line MBL1 to see whether or not the current flows through the selected memory cell.

In this instance, the first n-channel enhancement type switching transistor Qn80, the second n-channel enhancement type switching transistor Qn81, the third n-channel enhancement type switching transistors Qn82 to Qn85, the fourth n-channel enhancement type switching transistors Qn86/Qn87, the fifth n-channel enhancement type switching transistor Qn88 and the sixth n-channel enhancement type switching transistors Qn89 to Qn92 respectively serve as a first selecting sub-unit, a second selecting sub-unit, a third selecting sub-unit, a fourth selecting sub-unit, a fifth selecting sub-unit and a sixth selecting sub-unit.

Although particular embodiments of the present invention have been shown and described, it will be obvious to those skilled in the art that various changes and modifications may be made without departing from the spirit and scope of the present invention.

For example, each of the first and second selectors may have more than three kinds of switching transistors for providing the current path to or from a selected memory cell.

Moreover, the first and second selectors according to the present invention is applicable to another kind of semiconductor memory device such as, for example, an electrically programmable read only memory device and an electrically erasable and programmable read only memory device.

What is claimed is:

1. A semiconductor memory device fabricated on a semiconductor substrate, comprising:

a memory cell array having a plurality of memory cell groups each including a plurality of memory cells respectively storing data bits and arranged in rows and columns, the columns of memory cells of each memory cell group being formed between a plurality of conductive lines extending in parallel to one another;

a plurality of word lines associated with said memory cell array, and respectively connected to the rows of memory cells for selectively accessing the data bits stored therein;

a plurality of bit lines respectively associated with said plurality of memory cell groups, and extending over said memory cell array, one of said plurality of bit lines being associated with said each memory cell group;

a plurality of discharging lines selectively associated with said plurality of memory cell groups, and extending over said memory cell array, two of said plurality of discharging lines being associated with said each memory cell group;

a first selector connected between said plurality of bit lines and said memory cell array, and including a plurality of first selecting units respectively associated with said plurality of memory cell groups, one of said plurality of first selecting units being connected between said one of said plurality of bit lines and said each memory cell group so as to cause a current to flow from said one of said plurality of bit lines to said each memory cell group, said one of said plurality of first selecting units including a plurality of selecting sub-units for forming a first current path from said one of said plurality of bit lines to two of said plurality of conductive lines of said each memory cell group, said plurality of selecting sub-units having a first selecting sub-unit responsive to a first control signal line so as to provide a first conductive path for said current, a second selecting sub-unit responsive to a second control signal line so as to provide a second conductive path for said current, and a third selecting sub-unit responsive to a third control signal line so as to provide a third conductive path for said current; and a second selector connected between said memory cell array and said plurality of discharging lines, and including a plurality of second selecting units respectively associated with said plurality of memory cell groups, one of said plurality of second selecting units being connected between said each memory cell group and said two of said plurality of discharging lines so as to cause said current to flow from said each memory cell group to said two of said plurality of discharging lines, said one of said plurality of second selecting units including a plurality of other selecting sub-units for forming a second current path from said two of said plurality of conductive lines of said each memory cell group to said two of said plurality of discharging lines, said plurality of other selecting sub-units having a fourth selecting sub-unit responsive to a fourth control signal line so as to provide a fourth conductive path for said current, a fifth selecting sub-unit responsive to a fifth control signal line so as to provide a fifth conductive path for said current, and a sixth selecting sub-unit responsive to a sixth control signal line so as to provide a sixth conductive path for said current, conductive paths selected from said first to sixth conductive paths forming said first and second current paths.

2. The semiconductor memory device as set forth in claim 1, in which said plurality of conductive lines are implemented by first to ninth conductive lines, said one of said plurality of first selecting unit including:

a first switching transistor connected between said one of said plurality of bit lines and said fifth conductive line and serving as said first selecting sub-unit, second switching transistors connected between said one of said plurality of bit lines and said third and seventh conductive lines, respectively, and serving as said second selecting sub-unit, and third switching transistors having respective first ends selectively connected to said first and second switching transistors and respective second ends respectively connected to said second, fourth, sixth and eight conductive lines, and serving as said third selecting sub-unit, said one of said plurality of second selecting unit including:

fourth switching transistors connected between said first and ninth conductive lines and said two of said plurality of discharging lines, respectively, and serving as said fourth selecting sub-unit, fifth switching transistors connected between said third and seventh conductive lines and said two of said plurality of discharging lines, respectively, and serving as said fifth selecting sub-unit, and sixth switching transistors connected between said second, fourth, sixth and eighth conductive lines and said fourth and fifth switching transistors, respectively, and serving as said sixth selecting sub-unit.

3. The semiconductor memory device as set forth in claim 2, in which said one of said plurality of bit lines and said two of said plurality of discharging lines are respectively connected to a first common node between said first and second switching transistors and second and third common nodes between said fourth and fifth switching transistors through a first contact hole and second and third contact holes.

4. The semiconductor memory device as set forth in claim 1, in which said plurality of conductive lines are implemented by first to ninth conductive lines, said one of said plurality of first selecting unit including a first switching transistor connected between said one of said plurality of bit lines and said fifth conductive line and serving as said first selecting sub-unit, second switching transistors connected between said first switching transistor and said third and seventh conductive lines, respectively, and serving as said second selecting sub-unit, and third switching transistors connected between said first and second switching transistors and said second, fourth, sixth and eighth conductive lines, respectively, and serving as said third selecting sub-unit, said one of said plurality of second selecting unit including fourth switching transistors connected between said first and ninth conductive lines and said two of said plurality of discharging lines, respectively, and serving as said fourth selecting sub-unit, fifth switching transistors connected between said third and seventh conductive lines and said fourth switching transistors, respectively, and serving as said fifth selecting sub-unit, and sixth switching transistors connected between said second, fourth, sixth and eighth conductive lines and said fourth and fifth switching transistors, respectively, and serving as said sixth selecting sub-unit.

5. The semiconductor memory device as set forth in claim 4, in which said one of said plurality of bit lines and said two of said plurality of discharging lines are respectively connected to said first switching transistor and said fourth switching transistors through a first contact hole and second and third contact holes.

6. The semiconductor memory device as set forth in claim 1, in which said plurality of conductive lines are implemented by first to ninth conductive lines, said one of said plurality of first selecting unit including a first switching transistor connected between said one of said plurality of bit lines and said seventh conductive line and serving as said first selecting sub-unit, a second switching transistor connected between said one of said plurality of bit lines and said third conductive line, and serving as said second selecting sub-unit, and third switching transistors connected between said first and second switching transistors and said second, fourth, sixth and eighth conductive lines, respectively, and serving as said third selecting sub-unit, said one of said plurality of second selecting unit including fourth switching transistors connected between said first and ninth conductive lines and said two of said plurality of discharging lines, respectively, and serving as said fourth selecting sub-unit, a fifth switching transistor connected between said fifth conductive line and one of said fourth switching transistors, and serving as said fifth selecting sub-unit, and sixth switching transistors connected between said second, fourth, sixth and eighth conductive lines and said fourth and fifth switching transistors, respectively, and serving as said sixth selecting sub-unit.

7. The semiconductor memory device as set forth in claim 6, in which said one of said plurality of bit lines and said two of said plurality of discharging lines are respectively connected to a first common node between said first and second switching transistors and second and third common nodes between said fourth and fifth switching transistors through a first contact hole and second and third contact holes.

* * * * *